(12) United States Patent
Ito

(10) Patent No.: US 10,959,358 B2
(45) Date of Patent: Mar. 23, 2021

(54) ELECTRONIC COMPONENT MODULE

(71) Applicant: TAIYO YUDEN CO., LTD., Tokyo (JP)

(72) Inventor: Taiji Ito, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/428,596

(22) Filed: May 31, 2019

(65) Prior Publication Data

US 2019/0378802 A1 Dec. 12, 2019

(30) Foreign Application Priority Data

Jun. 8, 2018 (JP) .............................. JP2018-110517

(51) Int. Cl.
*H01L 23/552* (2006.01)
*H05K 9/00* (2006.01)
(Continued)

(52) U.S. Cl.
CPC ........... *H05K 9/0026* (2013.01); *H01L 21/56* (2013.01); *H01L 23/552* (2013.01); *H01L 24/97* (2013.01);
(Continued)

(58) Field of Classification Search
CPC ....... H01L 23/552; H01L 23/60; H01L 21/56; H01L 24/97; H01L 2924/19105; H01L 2924/12042; H01L 2225/06537; H01L 2924/3025; H01L 23/5225; H01L 2223/6677; H01L 23/66; H05K 9/0084; H05K 9/0037; H05K 3/284; H05K 5/0095; H05K 3/34; H05K 1/0218; H05K 2201/10371; H05K 2201/09818; H05K 9/0026

See application file for complete search history.

(56) References Cited

U.S. PATENT DOCUMENTS

| 2003/0128526 A1* | 7/2003 | Sakai ..................... H05K 3/403 361/736 |
| 2012/0008288 A1* | 1/2012 | Tsukamoto ............. H01L 24/97 361/736 |
| 2013/0075143 A1 | 3/2013 | Kasajima et al. |

FOREIGN PATENT DOCUMENTS

| JP | 2004172176 A | 6/2004 |
| JP | 2009033114 A | 2/2009 |

(Continued)

*Primary Examiner* — Cuong B Nguyen
(74) *Attorney, Agent, or Firm* — Law Office of Katsuhiro Arai

(57) ABSTRACT

An electronic component module includes: electronic components mounted on a substrate, each of the electronic components having terminals located on a side, upper, and/or lower surface thereof; and a shield that is located on the substrate, has side plates surrounding the electronic components, and is supplied with a ground potential, wherein in an electronic component closest to one side plate of the side plates among one or more electronic components, in each of which at least one terminal of the terminals is located on the side and/or upper surface, a terminal a first distance of which to the one side plate is shortest among the at least one terminal is a first terminal supplied with the ground potential, and a second distance each of second terminals not supplied with the ground potential to the one side plate is greater than the first distance.

9 Claims, 10 Drawing Sheets

(51) Int. Cl.
  *H01L 21/56*    (2006.01)
  *H01L 23/00*    (2006.01)
  *H05K 3/28*     (2006.01)
  *H05K 5/00*     (2006.01)
  *H05K 3/34*     (2006.01)
  *H05K 1/02*     (2006.01)

(52) U.S. Cl.
  CPC ........... *H05K 1/0218* (2013.01); *H05K 3/284* (2013.01); *H05K 3/34* (2013.01); *H05K 5/0095* (2013.01); *H05K 9/0037* (2013.01); *H05K 9/0084* (2013.01); *H01L 2924/12042* (2013.01); *H01L 2924/19105* (2013.01); *H05K 2201/10371* (2013.01)

(56) References Cited

FOREIGN PATENT DOCUMENTS

| | | |
|---|---|---|
| JP | 2013074289 A | 4/2013 |
| JP | 2015195398 A | 11/2015 |

\* cited by examiner

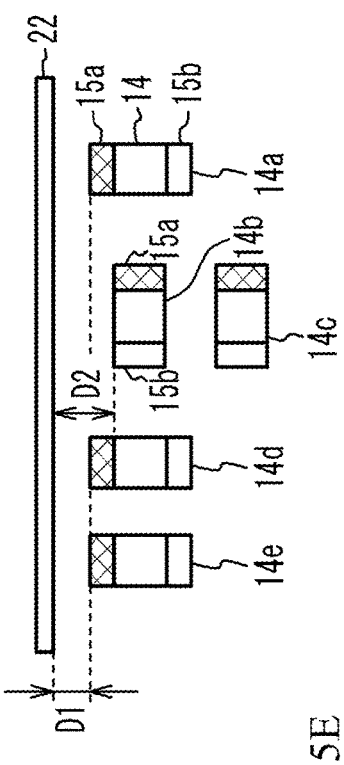
FIG. 5A STRUCTURE D
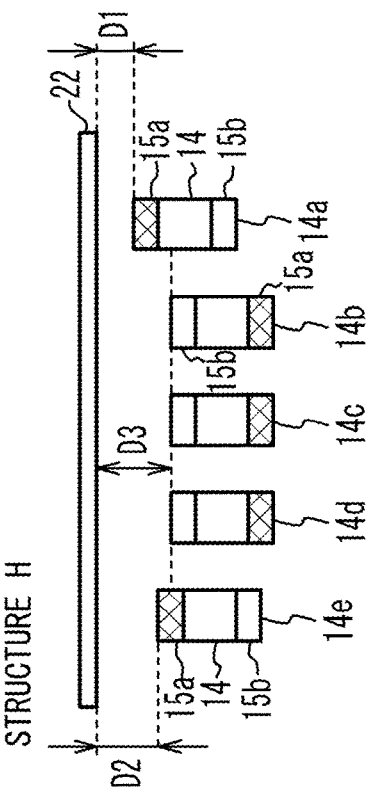
FIG. 5B STRUCTURE E
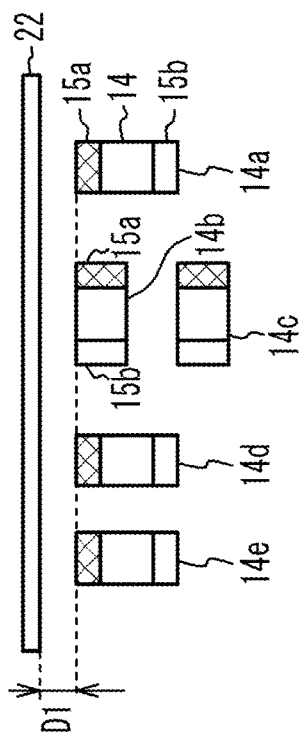
FIG. 5C STRUCTURE F
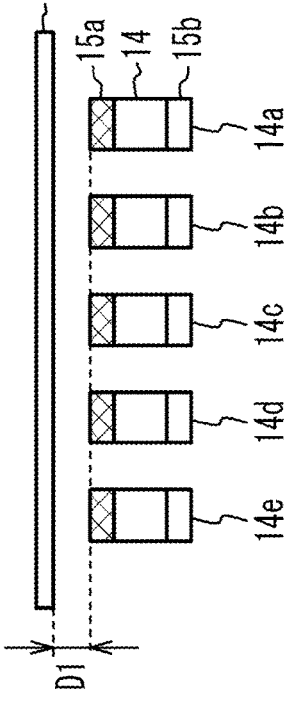
FIG. 5D STRUCTURE G
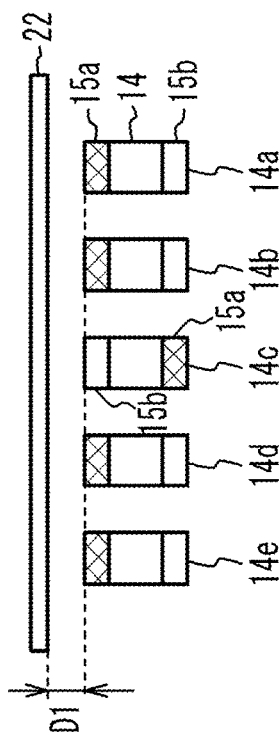
FIG. 5E STRUCTURE H FIG. 7A
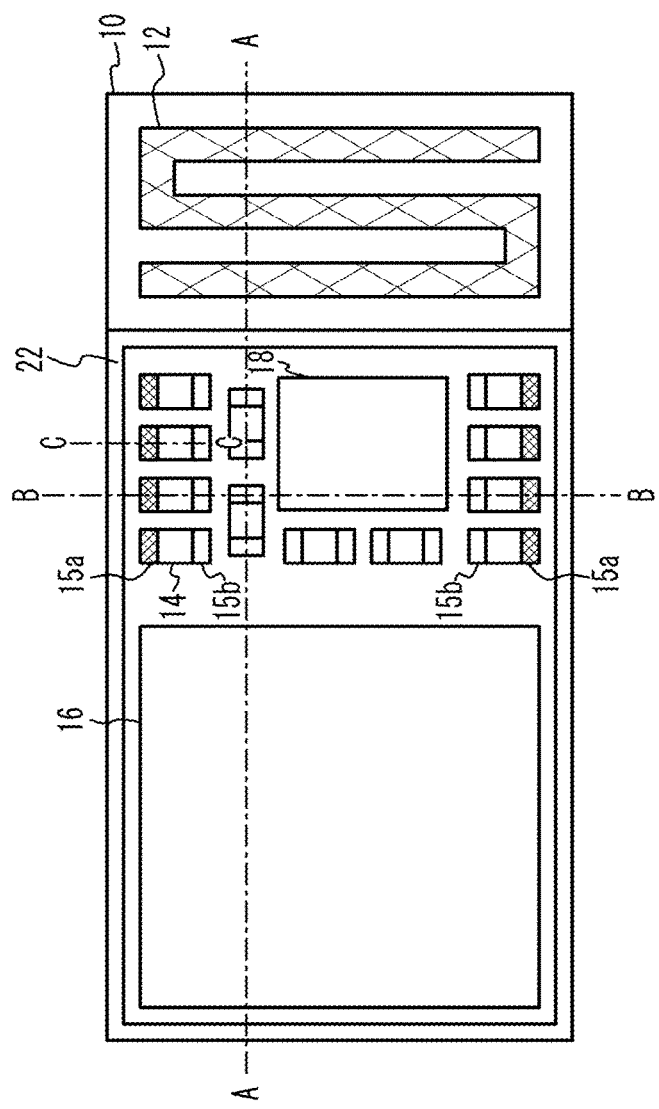
FIG. 7B
FIG. 7C
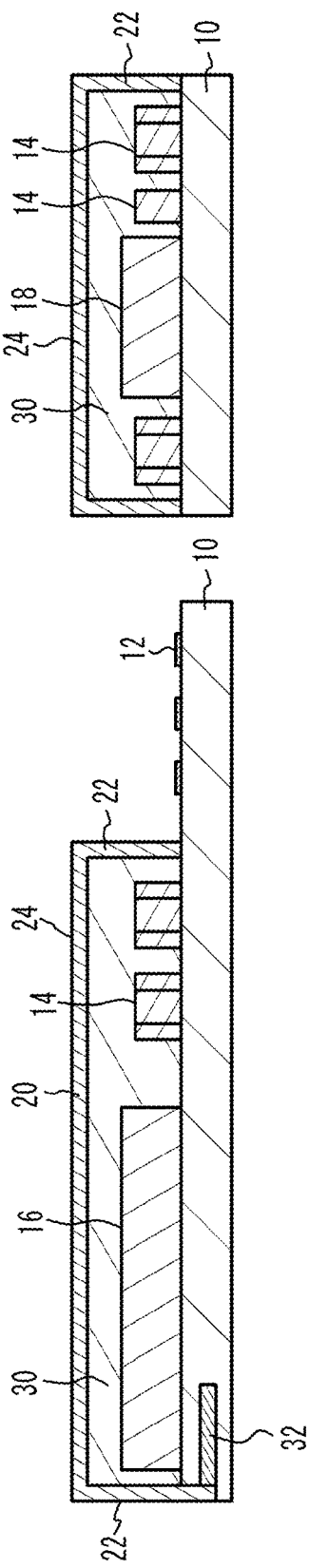

ELECTRONIC COMPONENT MODULE

CROSS-REFERENCE TO RELATED APPLICATION

This application is based upon and claims the benefit of priority of the prior Japanese Patent Application No. 2018-110517, filed on Jun. 8, 2018, the entire contents of which are incorporated herein by reference.

FIELD

A certain aspect of the present disclosure relates to an electronic component module.

BACKGROUND

It has been known that a conductive shield is provided to a module, in which an electronic component is mounted, so as to cover the electronic component as disclosed in, for example, Japanese Patent Application Publication Nos. 2004-172176, 2009-33114, 2013-74289, and 2015-195398 (hereinafter, referred to as Patent Documents 1 through 4).

SUMMARY

According to a first aspect of the present invention, there is provided an electronic component module including: a substrate; electronic components mounted on the substrate, each of the electronic components having terminals located on a side surface, an upper surface, and/or a lower surface thereof; and a shield located on the substrate so as to cover the electronic components, the shield having an upper plate and one or more side plates, the shield being supplied with a ground potential, the upper plate being located above the electronic components, the one or more side plates extending from the upper plate toward the substrate and surrounding the electronic components, wherein in an electronic component closest to one side plate of the one or more side plates among one or more electronic components, in each of which at least one terminal of the terminals is located on the side surface and/or the upper surface, of the electronic components, a terminal a first distance of which to the one side plate is shortest among the at least one terminal is a first terminal to which the ground potential is supplied, and a second distance of one or more second terminals, to which the ground potential is not supplied, of the at least one terminal to the one side plate is greater than the first distance.

According to a second aspect of the present invention, there is provided an electronic component module including: a substrate having a rectangular shape; ground lands located on the substrate and arranged along a first side surface of the substrate; connection members located on the ground lands; electronic components of which ground terminals are connected to the ground lands through the connection members; a sealing layer located on the substrate so as to cover the electronic components, a side surface of the sealing layer being formed by cutting; and a shield that is in contact with a part to which at least one of the ground lands, the connection members, and the ground terminals is exposed from the sealing layer, and covers a periphery of the sealing layer.

BRIEF DESCRIPTION OF THE DRAWINGS

FIG. 5A through FIG. 5E are plan views of wireless modules having structures D through H, respectively;

FIG. 7A is a plan view of a wireless module in accordance with a second embodiment, FIG. 7B is a cross-sectional view taken along line A-A in FIG. 7A, and FIG. 7C is a cross-sectional view taken along line B-B in FIG. 7A;

DETAILED DESCRIPTION

In a module provided with a conductive shield covering an electronic component mounted in the module, the shield inhibits electromagnetic waves from leaking from the electronic component and/or inhibits electromagnetic waves from interfering with the electronic component. However, a space is provided between the shield and the electronic component so that the shield and the electronic component are not in contact with each other. Thus, the size of the module increases.

Hereinafter, with reference to the accompanying drawings, embodiments of the present disclosure will be described. Embodiments hereinafter will describe a wireless module as an electronic component module.

First Embodiment

Figure 1C:
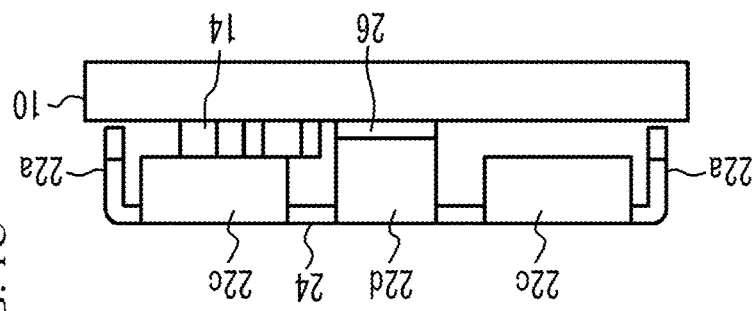
FIG. 1B and FIG. 1C are side views of the wireless module in accordance with the first embodiment.
Figure 1A:
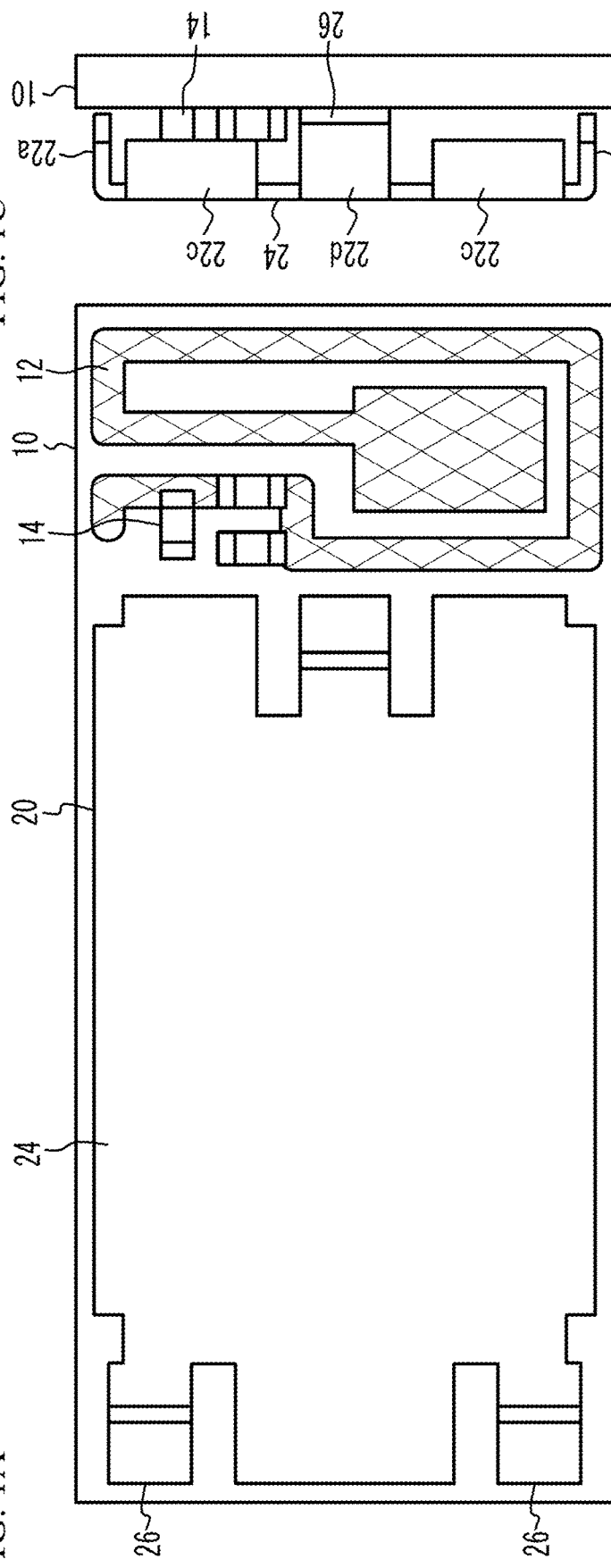
FIG. 1A is a plan view of a wireless module in accordance with a first embodiment.
Figure 1B:
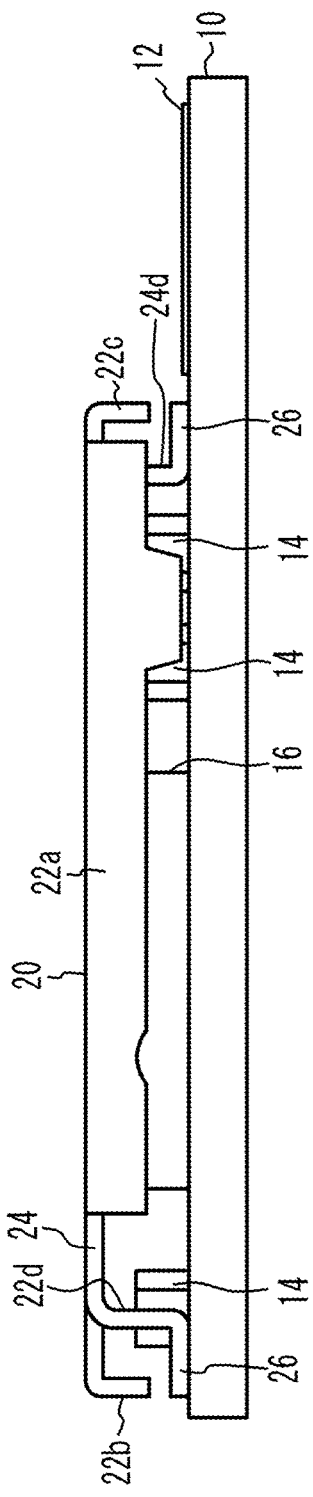
Figure 2:
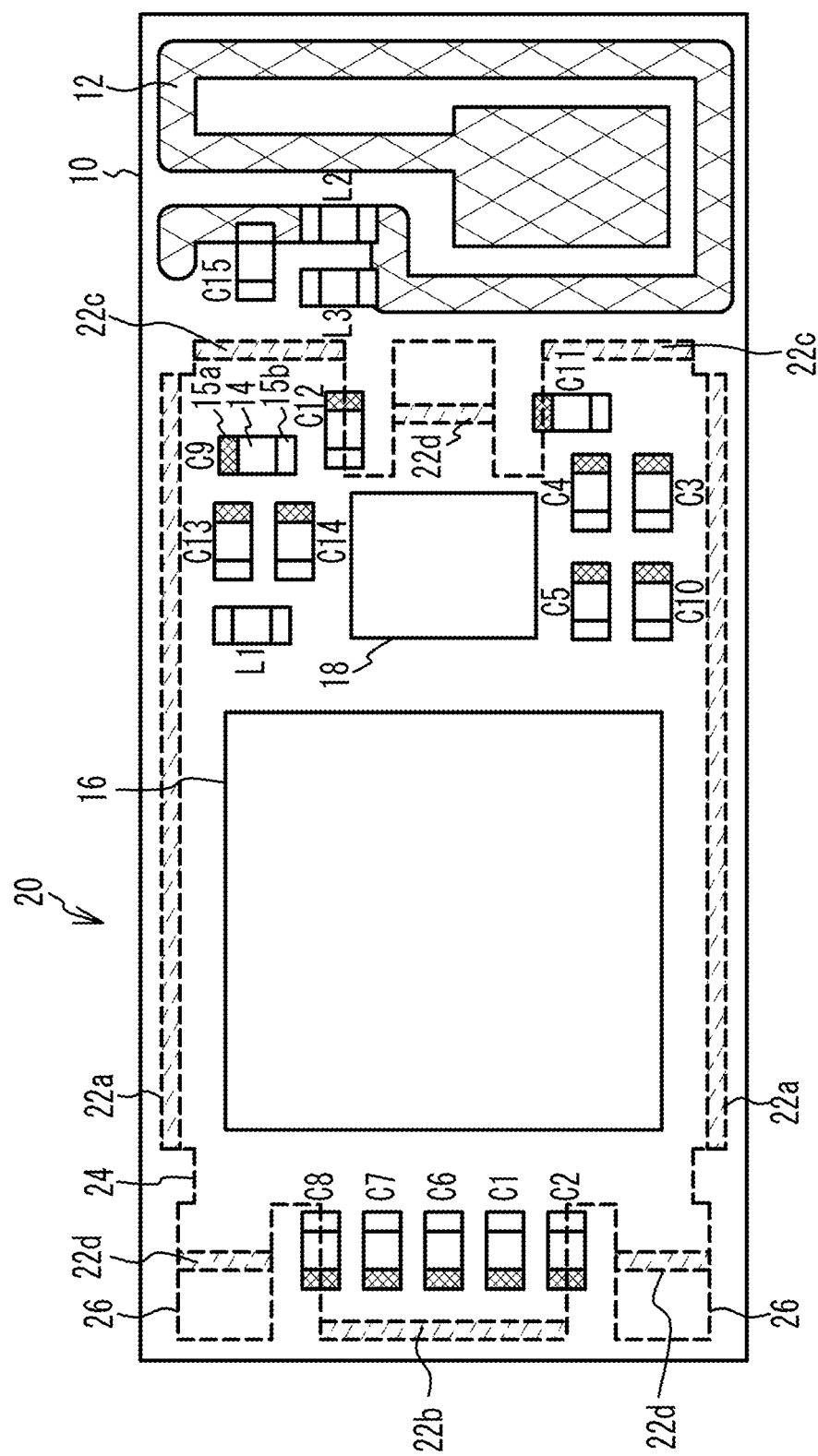
FIG. 2 is a plan view of the wireless module in accordance with the first embodiment where a shield is removed.
Figure 3:
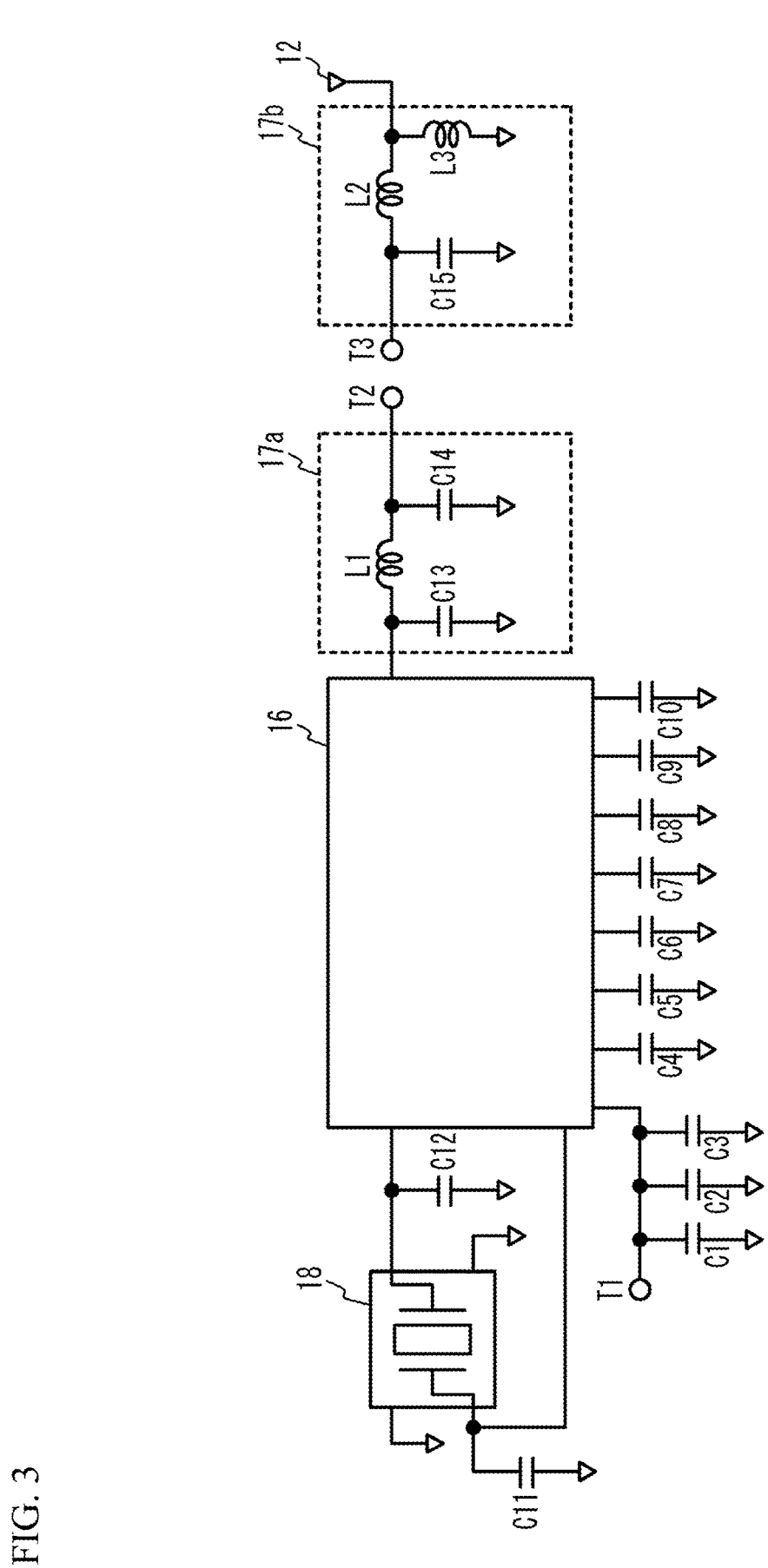
FIG. 3 is a block diagram of the wireless module in accordance with the first embodiment.

FIG. 1A is a plan view of a wireless module in accordance with a first embodiment, and FIG. 1B and FIG. 1C are side views of the wireless module in accordance with the first embodiment. FIG. 2 is a plan view of the wireless module in accordance with the first embodiment where a shield 20 is removed. FIG. 3 is a block diagram of the wireless module in accordance with the first embodiment. In FIG. 2, the shield 20 is indicated by a dashed line, and side plates 22a through 22d are indicated by hatching. A terminal 15a, which is coupled to a ground, of terminals 15a and 15b of an electronic component 14 is indicated by cross-hatching.

As illustrated in FIG. 1A through FIG. 2, the electronic components 14, an integrated circuit 16, and an oscillator 18 are located on the upper surface of a substrate 10. The shield 20 is provided so as to cover the electronic components 14, the integrated circuit 16, and the oscillator 18. An antenna 12 is formed on the upper surface of the substrate 10.

The substrate 10 is, for example, a multilayered substrate in which insulating layers are stacked. Examples of the insulating layer include, but are not limited to, a resin layer made of an epoxy resin or a polyimide resin, or a ceramic layer made of sintered ceramic. The resin layer may contain fibers or fillers for reinforcement. The substrate 10 has a thickness of, for example, 0.1 mm to 1 mm. Formed on at least the upper surface of the substrate 10 are conductive patterns for mounting a component and forming a circuit. The conductive patterns include an electrode, a wiring line, and/or a wiring line integrated with the electrode. The antenna 12 is formed at the same time as, for example, the conductive patterns, and is an antenna pattern of which the main material is copper. The antenna 12 may be an antenna pattern formed of a conductive layer of which the main material is gold, silver, or aluminum. The planar shape of the antenna 12 is a meander shape or an inverted-F shape. The antenna 12 may be, for example, a patch antenna or a multi-layer chip antenna. The frequency of electromagnetic waves transmitted/received by the antenna 12 is, for example, 0.8 GHz to 5 GHz. For example, the wireless module is a Bluetooth (registered trademark) module of which the frequency is 2.4 GHz.

The electronic component 14 is a discrete electronic component such as, but not limited to, a capacitor, an inductor, or a resistor. The electronic component 14 has two terminals 15a and 15b. The terminals 15a and 15b are located in both end portions of the bar-like electronic component 14. The side surfaces and the upper surfaces of the terminals 15a and 15b are exposed. In other words, the electronic component 14 has a hexahedron shape of which the planar shape is rectangular, and the terminals 15a and 15b are located in opposed shorter sides of the rectangle. The terminal 15a is a ground terminal coupled to a ground and supplied with a ground potential. The terminal 15b is a terminal to which a ground potential is not supplied. The integrated circuit 16 is an integrated circuit (IC). The integrated circuit 16 includes a silicon-based semiconductor substrate on which the electronic circuit is formed. The integrated circuit 16 is the resin-sealed semiconductor substrate having the electronic circuit formed on the surface of the semiconductor substrate, a bare chip of the semiconductor substrate, a wafer level package (WLP), or a chip size package (CSP). The oscillator 18 is a crystal oscillator. The terminals of the integrated circuit 16 are located on the lower surface of the integrated circuit 16, and are exposed to neither the side surfaces nor the upper surface of the integrated circuit 16. The terminals of the oscillator 18 are located on the lower surface of the oscillator 18, and are exposed to neither the side surfaces nor the upper surface of the oscillator 18. When the integrated circuit 16 is a bare chip and is face-up mounted on the substrate 10, the terminals are located on the upper surface of the integrated circuit 16. When the integrated circuit 16 is face-down mounted on the substrate 10, the terminals are located on the lower surface of the integrated circuit 16. In addition, the side surface and/or the upper surface of the integrated circuit 16 may be covered with a ground terminal (a shield layer), and the side surface and/or the upper surface of the oscillator 18 may be covered with a ground terminal (a shield layer).

The shield 20 is a metal plate such as, but not limited to, a stainless steel plate, an aluminum plate, a nickel silver plate, or a copper plate. The shield 20 has the side plates 22a through 22d, an upper plate 24, and a lower plate 26. The upper plate 24 is located above the electronic components 14, the integrated circuit 16, and the oscillator 18 so as to overlap with the electronic components 14, the integrated circuit 16, and the oscillator 18 in plan view. The side plates 22a through 22d are formed so as to bend from the upper plate 24 toward the substrate 10. The planar shape of the substrate 10 is rectangular, and the side plates 22a through 22d are provided along the sides of the rectangle (for example, in a direction parallel to the extension directions of the sides). The side plates 22a through 22d are located so as to surround the electronic components 14, the integrated circuit 16, and the oscillator 18 in plan view. The lower plate 26 is formed so as to bend from the side plate 22d outward. The lower plate 26 is bonded to the ground electrode (not illustrated) located on the upper surface of the substrate 10. Accordingly, the shield 20 is electrically connected to a ground, and a ground potential is supplied to the shield 20.

As illustrated in FIG. 3, the integrated circuit 16 is coupled to terminals T1 and T2. The terminal T1 is a power supply terminal. A power source voltage is applied to the terminal T1. Capacitors C1 through C3 are connected in parallel between the terminal T1 and grounds. The capacitors C1 through C3 are bypass capacitors for the power source. Capacitors C4 through C10 are connected between the integrated circuit 16 and grounds. The capacitors C4 through C10 are bypass capacitors for the reference voltage generated in the integrated circuit 16. The oscillator 18 is coupled to the integrated circuit 16. The capacitor C11 is connected between a first end of the oscillator 18 and a ground, and the capacitor C12 is connected between a second end of the oscillator 18 and a ground. The capacitors C11 and C12 are capacitors for adjusting load capacitance.

A filter 17a is connected between the integrated circuit 16 and the terminal T2. The filter 17a is a C-L-C π-type filter, and is a low-pass filter that removes harmonic. An inductor L1 is connected in series between the terminal T2 and the integrated circuit 16. Each of first ends of capacitors C13 and C14 is coupled to a pathway between the terminal T2 and the integrated circuit 16, and each of second ends of the capacitors C13 and C14 is coupled to a ground. A matching circuit 17b is connected between a terminal T3 and the antenna 12. The matching circuit 17b is a C-L-L π-type circuit. An inductor L2 is connected in series between the terminal T3 and the antenna 12. Each of first ends of a capacitor C15 and an inductor L3 is coupled to a pathway between the terminal T3 and the antenna 12, and each of second ends of the capacitor C15 and the inductor L3 is coupled to a ground. The terminals T2 and T3 are electrically connected outside the wireless module. Accordingly, the characteristics of the antenna 12 can be independently measured. The terminals T2 and T3 may be electrically connected in the wireless module.

The integrated circuit 16 up-converts baseband signals for transmission input from the external circuit into high-frequency signals for transmission with use of oscillation signals output from the oscillator 18, and outputs the high-frequency signals for transmission to the antenna 12 through the terminal T2. The integrated circuit 16 down-converts high-frequency signals for reception input from the antenna 12 through the terminal T2 into baseband signals for reception with use of oscillation signals output from the oscillator 18, and outputs the baseband signals for reception to the external circuit.

As illustrated in FIG. 2, the capacitors C1 through C14 and the inductor L1 of the electronic components 14 are mounted inside the shield 20. The capacitor C15 and the inductors L2 and L3 of the electronic components 14 are mounted outside the shield 20.

The shield 20 inhibits electromagnetic waves emitted from the electronic components 14, the integrated circuit 16, and the oscillator 18 from leaking to the outside, and inhibits external electromagnetic waves from interfering with the electronic components 14, the integrated circuit 16, and the oscillator 18. The antenna 12 and the matching circuit 17b near the antenna 12 are located outside the shield 20 so that the shield 20 does not shield electromagnetic waves emitted from the antenna 12.

As illustrated in FIG. 2, in the first embodiment, the ground terminals 15a of the electronic components 14 arranged along the extension direction of the side plate 22b (the capacitors C1, C2, and C6 through C8) are located closer to the side plate 22 than the terminals 15b.

Structures A Through C

Figure 4A:
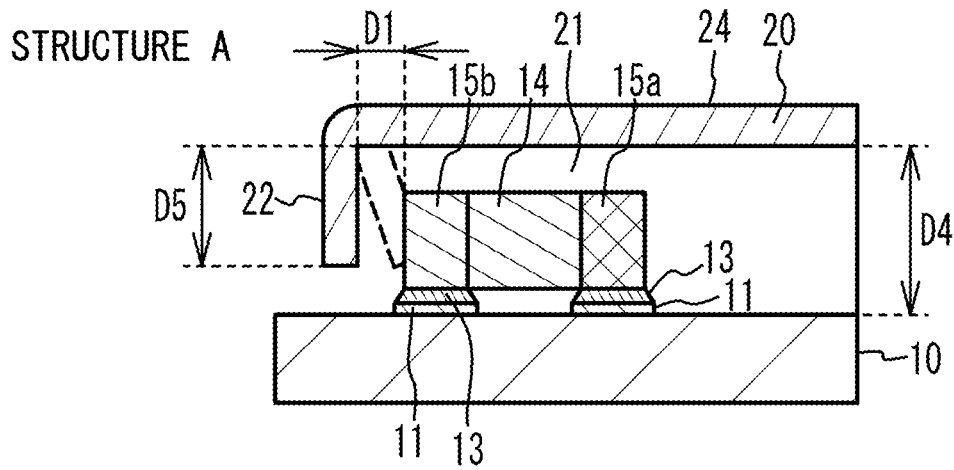
FIG. 4A through FIG. 4C are cross-sectional views of wireless modules having structures A through C, respectively.
Figure 4B:
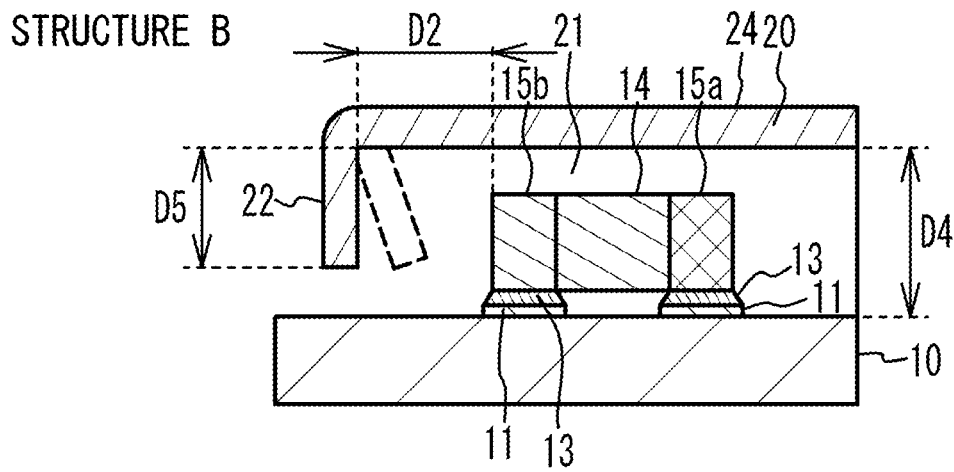
Figure 4C:
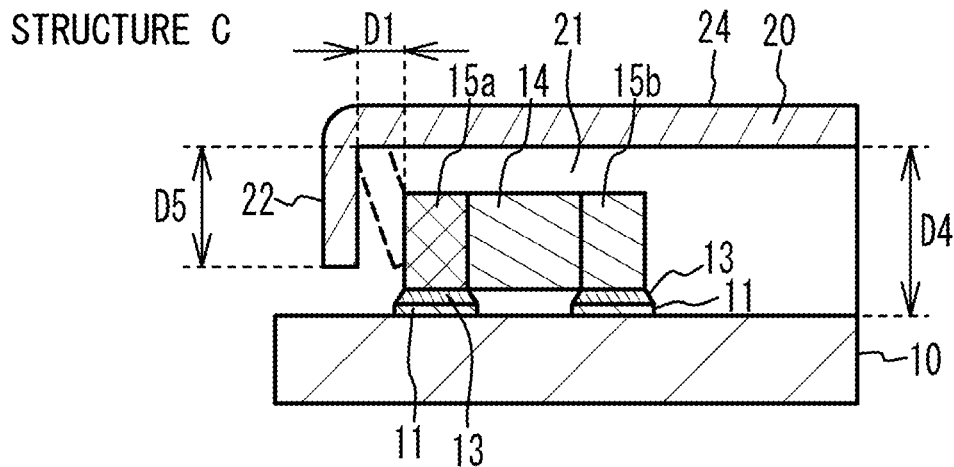

Structures A through C will be described to describe advantages of the first embodiment. FIG. 4A through FIG. 4C are cross-sectional views of wireless modules having the structures A through C, respectively. FIG. 4A through FIG. 4C correspond to the cross-section of the side plate 22b and the capacitor C1 in FIG. 2. The structures A and B correspond to comparative examples, and the structure C corresponds to the embodiment.

As illustrated in FIG. 4A through FIG. 4C, the terminals 15a and 15b of the electronic component 14 are bonded on lands 11, which are located on the upper surface of the substrate 10, by solder 13. The land 11 is formed of a conductive pattern located on the upper surface of the substrate 10. The main material of the conductive pattern is, for example, copper. Solder 13 is, for example, tin silver solder or tin silver copper solder. The terminals 15a and 15b are external electrodes located on the five surfaces of the electronic component 14, and is formed of a metal film of which the main material is, for example, nickel or copper. The terminals 15a of the capacitors C1 through C14 of the electronic components 14 are coupled to a ground, and the terminals 15b are coupled to a power line or a signal line other than a ground. The shield 20 is provided so as to cover the electronic components 14. The shield 20 has the upper plate 24 and a side plate 22 bending from the upper plate 24 toward the substrate 10. An air gap 21 filled with gas such as the air is located between the electronic component 14 and the shield 20. The distance between the upper surface of the substrate 10 and the lower surface of the upper plate 24 is represented by D4, and the distance between the lower surface of the side plate 22 and the lower surface of the upper plate 24 is represented by D5.

As illustrated in FIG. 4A, in the structure A, the terminal located closer to the side plate 22 among the terminals of the electronic component 14 is the terminal 15b that is not a ground terminal. In the case where the distance D1 between the electronic component 14 and the side plate 22 is short, when a shock is applied to the side plate 22, and the side plate 22 is thereby bent inward as indicated by a dashed line, the terminal 15b makes contact with the side plate 22. Accordingly, the terminal 15b and the side plate 22 electrically contact with each other, and the wireless module thereby breaks down. The contact between the terminal 15b and the side plate 22 is likely to occur when the terminal 15b is located on the side surface and/or the upper surface of the electronic component 14, while the contact between the terminal 15b and the side plate 22 hardly occurs when the terminal is located on neither the side surface nor the upper surface as in the integrated circuit 16 and the oscillator 18.

As illustrated in FIG. 4B, in the structure B, the distance D2 between the electronic component 14 and the side plate 22 is greater than that in the structure A. This structure inhibits the contact between the terminal 15b and the side plate 22 even when the side plate 22 bends as indicated by a dashed line. However, since the distance D2 increases, the size of the wireless module increases.

As illustrated in FIG. 4C, in the structure C, the terminal 15a of the electronic component 14 is located closer to the side plate 22 than the terminal 15b. Accordingly, even when the side plate 22 bends as indicated by a dashed line, and the terminal 15a and the side plate 22 thereby contact with each other, the function as an electronic circuit is not inhibited because the shield 20 and the terminal 15a have substantially identical electric potentials. Thus, the distance D1 between the electronic component 14 and the side plate 22 can be reduced. Therefore, the size of the wireless module is reduced.

Structures D Through H

FIG. 5A through FIG. 5E are plan views of wireless modules having structures D through H, respectively. FIG. 5A through FIG. 5E illustrate the structure of the side plate 22b and the capacitors C1, C2, and C6 through C8 in FIG. 2. The structures E and F correspond to comparative examples, and the structures D, and H correspond to the embodiment.

As illustrated in FIG. 5A through FIG. 5E, electronic components 14a through 14e are located apart from the side plate 22. Each of the electronic components 14a through 14e has the terminals 15a and 15b. The terminal 15a is a ground terminal.

As illustrated in FIG. 5A, the direction from the terminal 15a to the terminal 15b of each of the electronic components 14a through 14e is a direction intersecting with (for example, perpendicular to) the extension direction of the side plate 22. The terminals 15a of the electronic components 14a through 14e are all located closer to the side plate 22 than the terminals 15b. The distances D1 between the side plate 22 and the electronic components 14a through 14e are approximately equal to each other to the extent that allows manufacturing error and/or outer size tolerance. No other electronic components are located between each two of the electronic components 14a through 14e. In the structure D, even when a part of the side plate 22 bends inward, and makes contact with any one of the terminals 15a of the electronic components 14a through 14e, the shield 20 and the terminal 15a have approximately identical electric potentials, and thus, the function as an electronic circuit is not inhibited. Therefore, the distance D1 can be reduced.

As illustrated in FIG. 5B, in the structure E, the terminal 15b of the electronic component 14c is located closer to the side plate 22 than the terminal 15a. Other structures are the same as those of the structure D. In the structure E, when a part of the side plate 22 bends inward, and makes contact with the terminal 15b of the electronic component 14c, the electronic circuit breaks down.

As illustrated in FIG. 5C, in the structure F, the direction from the terminal 15a to the terminal 15b of each of the electronic components 14b and 14c is substantially parallel to the side plate 22. The distance D1 between the electronic component 14b and the side plate 22 is approximately equal to the distance D1 between each of the electronic components 14a, 14d, and 14e and the side plate 22. Other structures are the same as those of the structure D. In the structure F, when a part of the side plate 22 bends inward, and makes contact with the terminal 15b of the electronic component 14b, the electronic circuit breaks down.

As illustrated in FIG. 5D, in the structure the electronic components 14b and 14c are located further in than the electronic components 14b and 14c in the structure F. The distance D2 between the electronic component 14b and the side plate 22 is longer than the distance D1 between each of the electronic components 14a, 14d, and 14e and the side plate 22. Other structures are the same as those of the structure F. In the structure even when a part of the side plate 22 bends inward, the side plate 22 is unlikely to make contact with the terminal 15b of the electronic component 14b. Thus, the function as an electronic circuit is unlikely to be inhibited. The terminal 15b that is closest to the side plate 22 among the terminals other than the ground terminal is preferably separated from the side plate 22 by the same degree or more as the part farthest from the side plate 22 of the terminals 15a of the electronic components 14a, 14d, and 14e. This structure inhibits the side plate 22 from making contact with the terminal 15b even when the side plate 22 bends.

As illustrated in FIG. 5E, in the structure H, the electronic component 14a is located closest to the side plate 22 among the electronic components 14a through 14e. The distance between the electronic component 14a and the side plate 22 is represented by D1. The electronic component 14e is second-closest to the side plate 22. The distance between the electronic component 14e and the side plate 22 is represented by D2. The distance between each of the electronic components 14b through 14d and the side plate 22 is represented by D3. The distance D3 is greater than the distances D1 and D2. The terminals located closer to the side plate 22 of the electronic components 14b through 14d are the terminals 15b to which a ground potential is not supplied. In the structure H, even when a part of the side plate 22 bends inward, the side plate 22 is unlikely to make contact with the terminals 15b of the electronic components 14b through 14d. Thus, the function as an electronic circuit is unlikely to be inhibited.

In the first embodiment, the shield 20 includes the upper plate 24 located above a plurality of the electronic components 14, and one or more side plates 22a through 22d extending from the upper plate 24 toward the substrate 10 and surrounding the electronic components 14. One side plate 22b of the one or more side plates 22a through 22d is assumed to be the side plate 22 in any one of the structures D, G, and H. In this case, in the electronic component closest to the side plate 22 (for example, the electronic components 14a through 14e in the structure D, the electronic components 14a, 14d, and 14e in the structure G, and the electronic component 14a in the structure H), the terminal the distance of which to the side plate 22 (a first distance) is shortest among the terminals is the terminal 15a (a first terminal) to which a ground potential is supplied. The distance of each of the terminals 15b (a second terminal), to which a ground potential is not supplied, to the side plate 22 is greater than the first distance. Accordingly, even when the side plate 22 bends inward, the side plate 22 makes contact with the terminal 15a having an electric potential approximately identical to the electric potential of the side plate 22. Thus, the function of the electronic circuit is not inhibited. Therefore, the distance D1 in the structures D, G, and H can be reduced, and the size of the wireless module is reduced.

In addition, in each of at least first two electronic components in the order of closest to the side plate 22 (for example, the electronic components 14a through 14e in the structure D, the electronic components 14a, 14d, and 14e in the structure G, and the electronic components 14a and 14b in the structure H), the terminal the distance of which to the side plate 22 is shortest is the terminal 15a, and the second distance of each of the terminals 15b and the side plate 22 is greater than the first distance. This structure further reduces the size of the wireless module.

The distances D1 between at least two electronic components (for example, the electronic components 14a through 14e in the structure D, the electronic components 14a, 14d, and 14e in the structure G) of the electronic components and the side plate 22 are approximately equal to each other to the extent that allows the manufacturing error and/or the outer size tolerance. In each of the at least two electronic components, the terminal the distance of which to the side plate 22 is shortest is the terminal 15a, and the second distance of each of the terminals 15b and the side plate 22 is greater than the first distance. This structure further reduces the size of the wireless module.

Examples of the electronic components may include the integrated circuit 16, the oscillator 18, an electrically erasable programmable read-only memory (EEPROM), a flash memory, a chip filter, and a balun in addition to a discrete component.

For example, a case where the electronic components include the integrated circuit 16 and the oscillator 18 will be considered. It is assumed that in the integrated circuit 16, the terminals are located on the lower surface of the integrated circuit 16, an insulating material such as a resin is exposed to the side surfaces and the upper surface of the integrated circuit 16, and no terminal is located on the side surfaces and the upper surface of the integrated circuit 16. It is assumed that in the oscillator 18, the ground terminal for shielding is provided so as to cover the side surfaces and the upper surface of the oscillator 18, and other terminals are located on the lower surface of the oscillator 18.

In this case, it is sufficient if the terminals of the electronic component are located on the side surface, the upper surface, and/or the lower surface of the electronic component. As in the integrated circuit 16, when the side surfaces and the upper surface are formed of an insulating material, the electronic circuit hardly breaks down even when the shield 20 makes contact with the integrated circuit 16. Thus, the integrated circuit 16 having no terminals on the side surfaces and the upper surface may be the electronic component closest to the side plate 22. As in the oscillator 18, when the side surfaces and the upper surface are covered with a ground terminal, the electronic circuit hardly breaks down even when the shield 20 makes contact with the oscillator 18.

Considering the electronic component in a broad sense, it is sufficient if in the electronic component closest to the side plate 22 among the electronic components in each of which at least one terminal of the terminals is located on the side surface and/or the upper surface of the electronic component, the terminal a first distance of which to the side plate 22 is shortest among the terminals located on the side surface and/or the upper surface is a terminal to which a ground potential is supplied, and the distance between each of the terminals to which a ground potential is not supplied of the terminals located on the side surface and/or the upper surface and the side plate 22 is greater than the first distance.

The distance D1 is preferably shorter than the distance D4 between the substrate 10 and the upper plate 24. In this case, the side plate 22 is likely to make contact with the electronic component. Thus, the terminal located closer to the side plate 22 is preferably configured to be the terminal 15a. For example, the distance D1 is 0.25 mm, and the distance between the substrate 10 and the upper plate 24 is 0.7 mm. The distance D1 is preferably equal to or less than two thirds of D4, more preferably equal to or less than one half of D4. The distance D1 is preferably less than the distance D5 of the side plate 22. To reduce the size, the distance D1 is preferably 0.1 mm or greater and 0.5 mm or less, more preferably 0.1 mm or greater and 0.25 mm or less, further preferably 0.1 mm or greater and 0.2 mm or less. The distance between the terminal 15b closest to the side plate 22 and the side plate 22 (D2 in FIG. 5D and D3 in FIG. 5E) is preferably greater than D5, more preferably greater than D4.

The outer size tolerance of the discrete component is greater than, for example, the outer size tolerance of the integrated circuit 16. For example, in the wafer level chip size package (WLCSP), which is an example of the integrated circuit 16, the tolerance is ±0.05 mm, while the tolerance is ±0.1 mm in the discrete component. Thus, in the discrete component, the distance between the side plate 22 and the electronic component 14 is increased. For example, when the distance between the side plate 22 and the integrated circuit 16 is configured to be 0.25 mm, the distance between the side plate 22 and the electronic component 14 becomes 0.3 mm. Accordingly, the size of the wireless module increases. Thus, when the electronic components 14 are the discrete components such as capacitors, inductors, or resistors, the terminal closer to the side plate 22 is configured to be the terminal 15a. This structure shortens the distance between the side plate 22 and the electronic component 14 to, for example, 0.25 mm, and the size of the wireless module can be reduced.

The terminal 15a and the terminal 15b are exposed to both end portions of each of the electronic components 14. In this case, when the terminal 15b is located closer to the side plate 22 than the terminal 15a, the terminal 15b is likely to make contact with the side plate 22. Thus, the distance between the side plate 22 and the terminal 15b is to be increased, and thereby the size of the wireless module is increased. Thus, the terminal 15a is located closer to the side plate 22 than the terminal 15b. This structure reduces the size of the wireless module.

As illustrated in FIG. 3, the electronic components 14 are included in the electronic circuit that transmits high-frequency signals to the antenna 12 or receives high-frequency signals from the antenna 12. In this case, electromagnetic waves are likely to be emitted from the electronic component 14, and electric magnetic interference (EMI) becomes a problem. Thus, by providing the shield 20, the EMI from the electronic components 14 is reduced.

The side plate 22 and the electronic component 14 face each other across the air gap 21. In this case, the side plate 22 and the electronic component 14 are likely to contact with each other. Thus, the terminal 15a is preferably located closer to the side plate 22. The side plate 22 and the substrate 10 face each other across the air gap 21. In this case, when the upper plate 24 bends, the side plate 22 is likely to make contact with the electronic component 14. Thus, the terminal 15a is preferably located closer to the side plate 22.

First Variation of the First Embodiment

Figure 6:
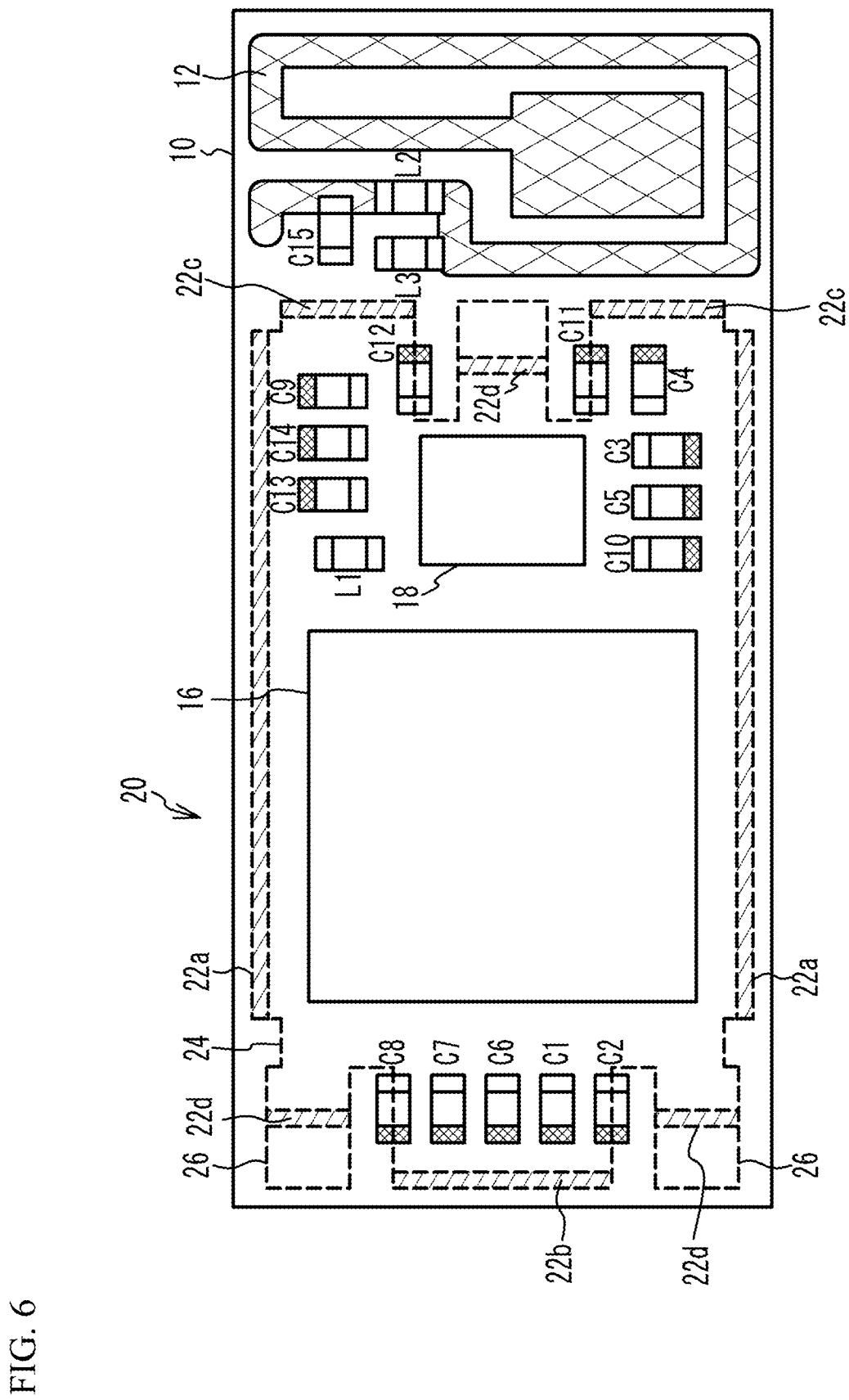
FIG. 6 is a plan view of a wireless module in accordance with a first variation of the first embodiment where a shield is removed.

FIG. 6 is a plan view of a wireless module in accordance with a first variation of the first embodiment where the shield is removed. As illustrated in FIG. 6, in the first variation of the first embodiment, the ground terminal 15a of the electronic component closest to the side plate 22a (the capacitors C3, C5, and C10 with respect to the lower side plate 22a, the capacitors C9, C13, and C14 with respect to the side plate 22a) among the electronic components 14 closest to the side plate 22 is located closer to the side plate 22. The ground terminal 15a of the electronic component closest to the side plate 22c (the capacitors C4 and C11 with respect to the lower side plate 22c, the capacitor C12 with respect to the upper side plate 22c) among the electronic components 14 closest to the side plate 22 is located closer to the side plate 22. Other structures are the same as those of the first embodiment, and the description thereof is thus omitted.

As in the first variation of the first embodiment, the ground terminal 15a of the electronic component closest to each of the side plates 22a through 22c is preferably located closer to the side plate than the terminal 15b. This structure reduces the distances between the side plates 22a through 22c and the electronic components 14, and thus reduces the size of the wireless module.

In the first embodiment and the variation thereof, as illustrated in FIG. 1 and FIG. 2, the shield 20 is fixed to the substrate 10 only by three lower plates 26 (fixing portions). The shield 20 may be fixed to the substrate 10 by four or more lower plates 26. However, in this case, when the shield 20 strains, the shield 20 may become unstable. As illustrated in FIG. 1 and FIG. 2, when the number of the lower plates 26 fixing the shield 20 is three, the shield 20 is stably fixed to the substrate 10. When the side plates 22a through 22c other than the side plates 22d, which are connected to the lower plates 26, are fixed to the substrate 10, the bonding layer such as solder is to be provided on the substrate 10. This results in the increase in size of the substrate 10. In addition, it is difficult to make the bonding state between the side plates 22a through 22c and the substrate 10 constant, and the production quality is difficult to keep. Therefore, the side plates 22a through 22c other than the side plates 22d, which are connected to the lower plates 26, are separated from the substrate 10.

In the above described structure, when the side plate 22 closest to the terminal 15a, to which a ground potential is supplied, is separated from the substrate 10 as in the structure C in FIG. 4, the side plate 22 is likely to make contact with the terminal 15a. Thus, the terminal 15a is preferably a ground terminal.

To stabilize the shield 20, the planar shape of the shield 20 is preferably a substantially rectangular shape, one lower plate 26 of three lower plates 26 is preferably located in the middle part of a first side of the substantially rectangular shape, and other two lower plates 26 are preferably located in both ends of a second side facing the first side. This structure allows the shield 20 to be stably fixed to the substrate 10.

Second Embodiment

FIG. 7A is a plan view of a wireless module in accordance with a second embodiment, FIG. 7B is a cross-sectional view taken along line A-A in FIG. 7A, and FIG. 7C is a cross-sectional view taken along line B-B in FIG. 7A. As illustrated in FIG. 7A through FIG. 7C, an insulating layer 30 is located on the substrate 10 so as to seal the electronic components 14, the integrated circuit 16, and the oscillator 18. The shield 20 is located on the surface of the insulating layer 30. The shield 20 has the upper surface of the shield 20 (corresponding to the upper plate 24) located on the upper surface of the insulating layer 30 and the side surface of the shield 20 (corresponding to the side plate 22) located on the side surface of the insulating layer 30. A ground wiring line 32, to which a ground potential is supplied, is located in the substrate 10. The ground wiring line 32 is exposed from the side surface of the substrate 10, and is in contact with the side plate 22. Accordingly, a ground potential is supplied to the shield 20. The ground wiring line 32 may be located on the upper surface of the substrate 10.

The insulating layer 30 is, for example, a resin layer, and is made of a thermosetting resin such as, but not limited to, an epoxy resin or a thermoplastic resin. The shield 20 is formed of a conductive layer of which the main material is a metal such as, but not limited to, gold, silver, copper, aluminum, or nickel, and is formed of a conductive paste, a plating film, or a sputtering film.

Figure 8A:
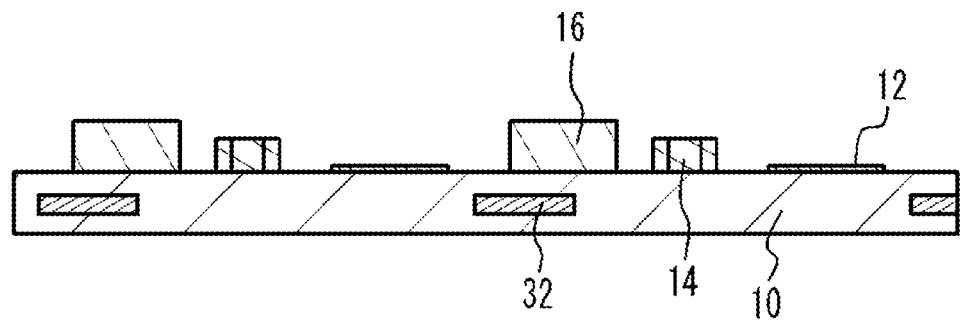
FIG. 8A through FIG. 8C are cross-sectional views (No. 1) illustrating a method of manufacturing the wireless module in accordance with the second embodiment.

FIG. 8A through FIG. 9C are cross-sectional views illustrating a method of manufacturing the wireless module in accordance with the second embodiment. As illustrated in FIG. 8A, the substrate 10 is prepared. The substrate 10 is, for example, a printed board such as an aggregate substrate, and conductive patterns are formed on at least the surface of the substrate 10. The conductive pattern is an electrode and/or a wiring line constituting the electronic circuit together with the electronic components 14, the integrated circuit 16 and/or the oscillator 18. The pattern of the antenna 12 is formed at the same time as the conductive pattern. The antenna 12 may be prepared as a component, and mounted. In the drawings, a plurality of the antennas 12 are formed on the upper surface of the substrate 10. When the antenna 12 is formed at the same time as the conductive pattern on the upper surface of the substrate 10, the antenna 12 is formed by, for example, plating. The conductive pattern and/or the antenna 12 may be formed by other methods such as screen printing. The antenna 12 may be formed on the lower surface of the substrate 10. A plurality of wiring lines (not illustrated) are formed on the surface of the substrate 10 and inside the substrate 10. The ground wiring line 32 of the wiring lines is a wiring line to which a ground potential is supplied. The electronic components 14 and the integrated circuit 16 are mounted on the electrodes such as lands on the upper surface of the substrate 10.

Figure 8B:
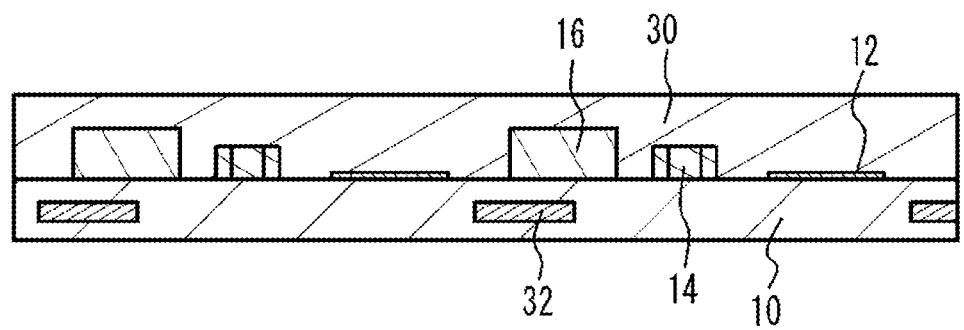

As illustrated in FIG. 8B, the insulating layer 30 is formed on the upper surface of the substrate 10 so as to cover the antennas 12, the electronic components 14, and the integrated circuits 16. The insulating layer 30 is, for example, a thermosetting resin or a thermoplastic resin. The insulating layer 30 is formed by transfer molding or vacuum printing.

Figure 8C:
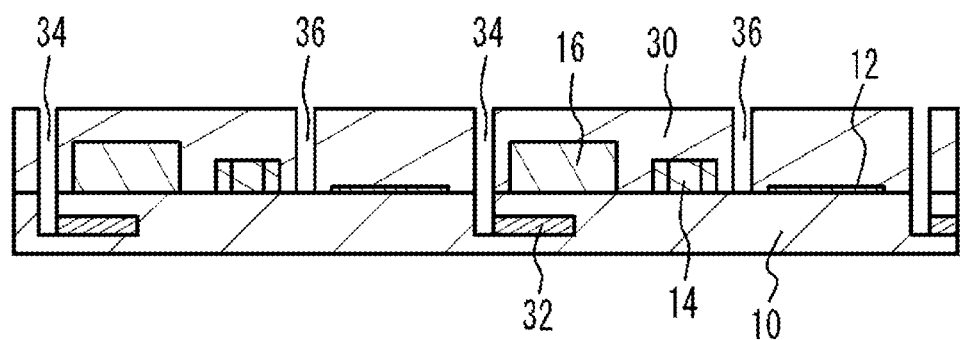

As illustrated in FIG. 8C, grooves 34 and 36 penetrating through the insulating layer 30 are formed. The groove 34 is formed so as to surround the region to be the wireless module in plan view. When the ground wiring line 32 inside the substrate 10 is to be exposed, the groove 34 is formed so as to reach the ground wiring line 32. The groove 36 is formed in at least the upper part of the insulating layer 30 between the electronic component 14 and the integrated circuit 16 and the antenna 12. The grooves 34 and 36 are formed by using, for example, a dicing blade or a laser beam.

Figure 9A:
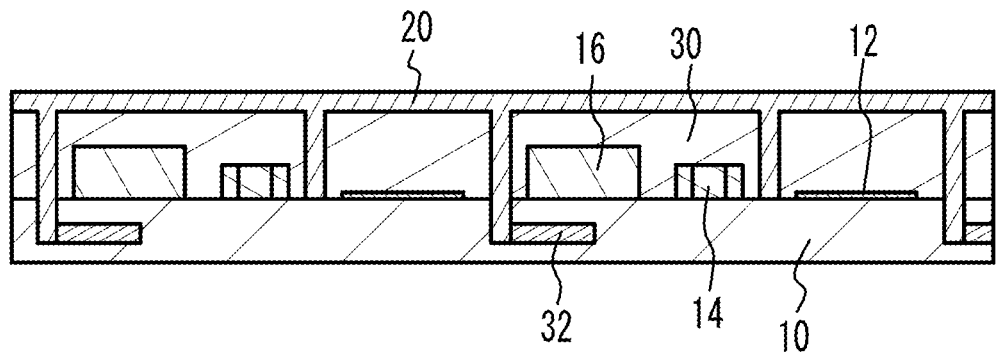
FIG. 9A through FIG. 9C are cross-sectional views (No. 2) illustrating the method of manufacturing the wireless module in accordance with the second embodiment.

As illustrated in FIG. 9A, the shield 20 is formed on the surface of the insulating layer 30 so as to fill the grooves 34 and 36. The shield 20 is formed by, for example, vacuum printing, plating, or sputtering. When the shield 20 is formed by vacuum printing, a metal paste such as, but not limited to, a silver paste is printed. When the shield 20 is formed by plating or sputtering, a metal film such as, but not limited to, a gold film, a nickel film, or a copper film is formed as a shield. The shield 20 may be formed by forming a seed layer by sputtering, and then forming a plating layer by plating.

Figure 9B:
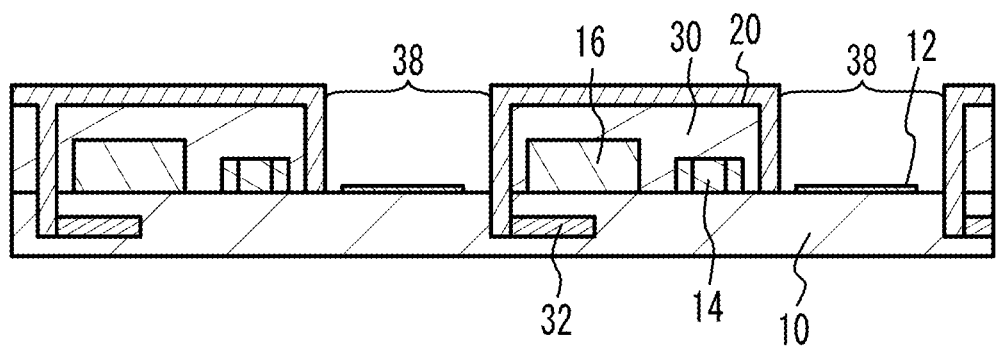

As illustrated in FIG. 9B, the shield 20 and the insulating layer 30 on the antenna 12 are removed. This process forms a recessed portion 38 between the grooves 34 and 36. The shield 20 and the insulating layer 30 are removed by cutting or irradiation of a laser beam. In FIG. 9B, the shield 20 and the insulating layer 30 on the antenna 12 are removed as completely as possible. However, when the shield 20 and the insulating layer 30 are removed by cutting, such as dicing with use of a rotating blade, it is difficult to cut the insulating layer 30 to the immediate vicinity of the antenna 12. Thus, when the shield 20 and the insulating layer 30 are removed by cutting, the shield 20 and a part of the upper part of the insulating layer 30 are removed in the recessed portion 38, and the remaining part of the insulating layer 30 remains on the antenna 12. When the antenna 12 is located on the lower surface of the substrate 10, the shield 20 and the insulating layer 30 may be entirely removed in the recessed portion 38.

Figure 9C:
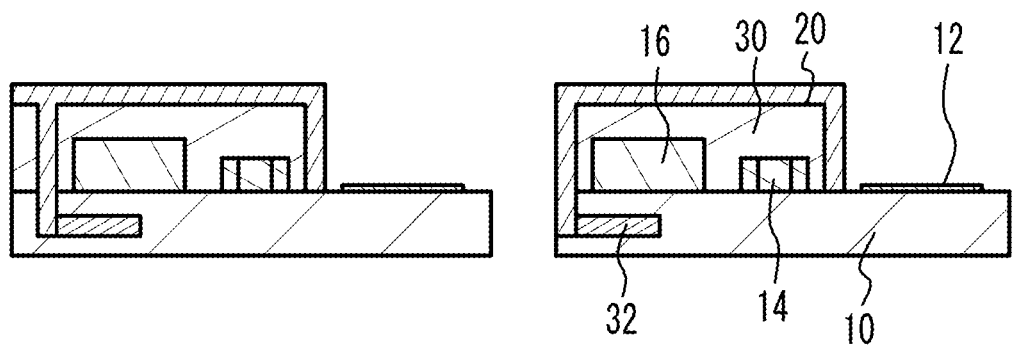

As illustrated in FIG. 9C, the substrate 10 is cut. The substrate 10 is cut by dicing using a dicing blade or laser dicing irradiating the substrate 10 with a laser beam. This process separates the substrate 10 into individual modules, and the wireless module of the second embodiment is manufactured.

As in the second embodiment, the insulating layer 30 may be located on the substrate 10 so as to seal the electronic components 14, and the shield 20 may be located on the surface of the insulating layer 30. Even when the insulating layer 30 is located between the electronic components 14 and the side plate 22, application of a shock to the shield 20 may cause the contact between the shield 20 and the electronic component 14. Thus, the ground terminal 15a of the electronic component 14 closest to the side plate 22 is preferably located closer to the side plate 22 of the shield 20 than the terminal 15b. This structure reduces the size of the wireless module.

Figure 10A:
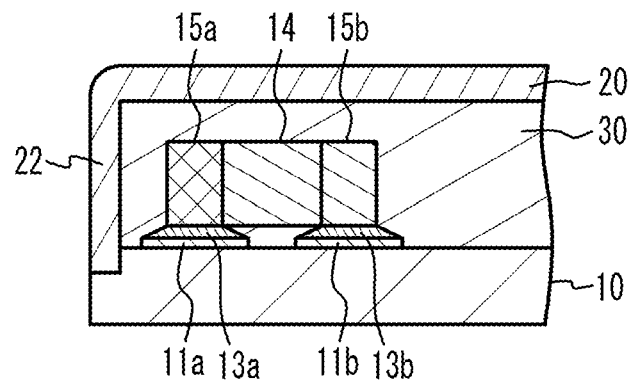
FIG. 10A and FIG. 10B are cross-sectional views of the wireless module of the second embodiment.
Figure 10B:
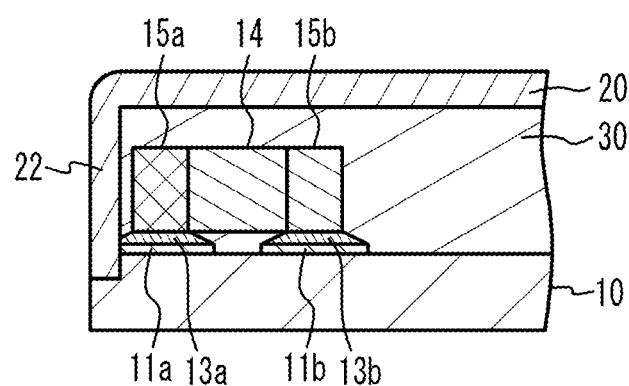
Figure 10C:
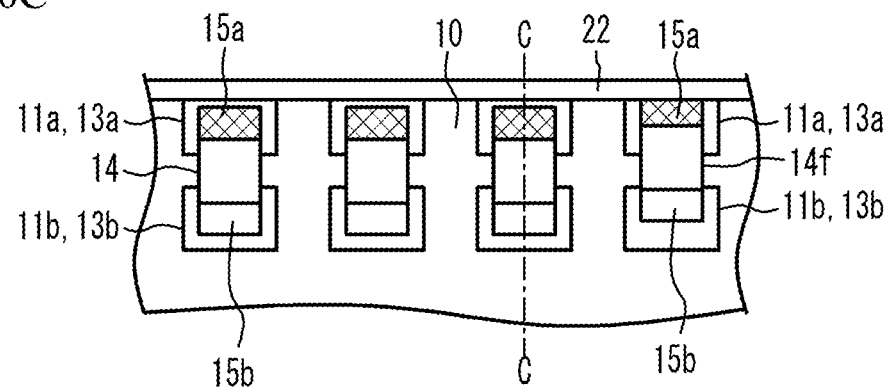
FIG. 10C is a plan view of the wireless module of the second embodiment.

FIG. 10A and FIG. 10B are cross-sectional views of the wireless module of the second embodiment, and FIG. 10C is a plan view of the wireless module of the second embodiment. FIG. 10A is a cross-sectional view taken along line C-C in FIG. 7A, and FIG. 10B is a cross-sectional view taken along line C-C in FIG. 10C. As illustrated in FIG. 10A through FIG. 10C, lands 11a and 11b are formed on the substrate 10. The lands 11a and 11b are arranged along a side of the substrate 10. The terminals 15a and 15b are bonded to the lands 11a and 11b through solder members 13a and 13b, respectively. The land 11a is supplied with a ground potential. In FIG. 10A, the side plate 22 of the shield 20 is located apart from the land 11a.

Since the electronic component 14 has a large outer size tolerance, the lands 11a and 11b are larger than the planar shapes of the terminals 15a and 15b. When the margin for aligning the groove 34 and the land 11a is small at the time of forming the groove 34 in FIG. 8C, the groove 34 and the land 11a may make contact with each other. In addition, the groove 34 and the solder member 13a may make contact with each other, or the groove 34 and the terminal 15a or 15b of the electronic component 14 may make contact with each other.

In this case, the side plate 22 makes contact with the land 11a and/or the solder member 13a as illustrated in FIG. 10B. As with an electronic component 14f illustrated in FIG. 10C, the side plate 22 may contact with the land 11a, the solder member 13a, and/or the terminal 15a. In the second embodiment, since a ground potential is supplied to the land 11a, the solder member 13a, and/or the terminal 15a, even when the land 11a, the solder member 13a and/or the terminal 15a makes contact with the side plate 22, the wireless module is inhibited from breaking down. As seen above, the land 11a located on the substrate 10 and bonded with the terminal 15a may be provided, and the side plate 22 may be in contact with the side surface of the land 11a. This structure makes the margin for aligning the groove 34 and the land 11a small, and thereby reduces the size of the wireless module.

In the second embodiment, as illustrated in FIG. 10B and FIG. 10C, a plurality of the lands 11a (ground lands) are located on the rectangular substrate 10 so as to be arranged along one side surface of the substrate 10. A plurality of the solder members 13a (connection members) are located on the lands 11a. The terminals 15a (ground terminals) of the electronic components 14 (for example, chip components) are connected to the lands 11a through the solder members 13a. The insulating layer 30 (a sealing layer) is located on the substrate 10 so as to cover the electronic components 14, and the side surface thereof is formed by cutting. The shield 20 is in contact with a part to which at least one of the lands 11a, a plurality of the solder members 13a, and the terminals 15a is exposed from the insulating layer 30, and covers the periphery of the insulating layer 30. This structure reduces the margin for aligning the groove 34 and the land 11a, and reduces the size of the wireless module. In addition, a ground potential is supplied to the shield 20.

The first embodiment and the variation thereof and the second embodiment describe a case where the electronic component module is a wireless module, but it is sufficient if the electronic component module is a module having a shield. I addition, a case where the wireless module has the antenna 12 has been described, but the antenna 12 may be provided outside the wireless module.

Although the embodiments of the present invention have been described in detail, it is to be understood that the various change, substitutions, and alterations could be made hereto without departing from the spirit and scope of the invention.

What is claimed is:

1. An electronic component module comprising:
    a substrate;
    electronic components mounted on the substrate, each of the electronic components having terminals located on a side surface, an upper surface, and/or a lower surface thereof; and
    a shield located on the substrate so as to cover the electronic components, the shield having an upper plate and one or more side plates, the shield being supplied with a ground potential, the upper plate being located above the electronic components, the one or more side plates extending from the upper plate toward the substrate and surrounding the electronic components,
    wherein in an electronic component closest to one side plate of the one or more side plates among one or more electronic components, in each of which at least two terminals of the terminals are located on the side surface and/or the upper surface, of the electronic components, a first distance of a first terminal, to which the ground potential is supplied, to the one side plate is shortest among the at least two terminals, and a second distance of one or more second terminals, to which the ground potential is not supplied, of the at least two terminals to the one side plate is greater than the first distance,
    wherein the first distance is less than a vertical distance between the substrate and the upper plate.

2. The electronic component module according to claim 1, wherein in each of at least first two electronic components in an order of closest to the one side plate among the one or more electronic components, the first distance of the first terminal, to which the ground potential is supplied, to the one side plate is shortest among the at least two terminals, and the second distance of each of the one or more second terminals to the one side plate is greater than the first distance.

3. The electronic component module according to claim 1, wherein
    distances between at least two electronic components including the electronic component closest to the one side plate of the one or more electronic components and the one side plate are approximately equal to each other,
    in each of the at least two electronic components, the first distance of the first terminal, to which the ground potential is supplied, to the one side plate is shortest among the at least two terminals, and the second distance of each of the one or more second terminals to the one side plate is greater than the first distance.

4. The electronic component module according to claim 1, wherein
    each of the electronic components is a discrete component that is a capacitor, an inductor, or a resistor.

5. The electronic component module according to claim 1, wherein
    the first terminals and the second terminals are exposed to both end portions of the electronic components.

6. The electronic component module according to claim 1, wherein
    the electronic components are included in an electronic circuit that transmits a high-frequency signal to an antenna or receives a high-frequency signal from the antenna.

7. The electronic component module according to claim 1, wherein
    the one side plate and the electronic component closest to the one side plate face each other across an air gap.

8. The electronic component module according to claim 1, wherein
    the shield is fixed to the substrate only by three fixing portions, a side plate other than the three fixing portions and the substrate are located away from each other, and
    the one side plate is the side plate other than the three fixing portions.

9. The electronic component module according to claim 8, wherein
    a planar shape of the shield is a substantially rectangular shape, and
    one of the three fixing portions is located in a middle part of a first side of the substantially rectangular shape, and other two of the three fixing portions are located in both ends of a second side facing the first side.

* * * * *